United States Patent
Inaba

[19]

[11] Patent Number: 5,936,911
[45] Date of Patent: Aug. 10, 1999

[54] STATIC TYPE SEMICONDUCTOR MEMORY DEVICE WITH TIMER CIRCUIT

[75] Inventor: Hideo Inaba, Kanagawa, Japan

[73] Assignee: NEC Corporation, Tokyo, Japan

[21] Appl. No.: 09/019,404

[22] Filed: Feb. 5, 1998

[30] Foreign Application Priority Data

Feb. 27, 1997 [JP] Japan ................................... 9-044040

[51] Int. Cl.⁶ .................................................. G11C 13/00
[52] U.S. Cl. ...................... 365/233; 365/154; 365/230.08
[58] Field of Search ..................................... 365/226, 203, 365/204, 154, 230.08

[56] References Cited

U.S. PATENT DOCUMENTS 5,642,320 6/1997 Jang ......................................... 365/154

FOREIGN PATENT DOCUMENTS 3156795 of 0000 Japan .
56675 of 0000 Japan .
63282992 of 0000 Japan .

*Primary Examiner*—Terrell W. Fears

[57] ABSTRACT

In a static type semiconductor memory device, a word decoder is connected to a plurality of word lines to decode an address signal to select one of the plurality of word lines. A resistor load type memory cell is connected to said selected word line. The resistor load type memory cell is composed of two pairs of a load resistor and a MOS transistor and the two pairs are connected to form a flip-flop. A word line voltage boosting circuit is connected to the word decoder to boost a voltage of the selected word line to a voltage higher than a power supply voltage in response to a boost control signal. A timer circuit includes a replica of the load transistor of one of the two pair and replicas of the MOS transistors of the two pair. The timer circuit generates the boost control signal for a predetermined time period in response to a start control signal to activate said word line voltage boosting circuit.

18 Claims, 9 Drawing Sheets

STATIC TYPE SEMICONDUCTOR MEMORY DEVICE WITH TIMER CIRCUIT

BACKGROUND OF THE INVENTION

1. Field of the Invention

The present invention generally relates to technique on a semiconductor device, and more specifically, to the technique for applying a boosted voltage to a word line for a predetermined time in a static type semiconductor memory device.

2. Description of the Related Art

Recently, needs of portable appliances such as portable telephones are considerably increased, and thus a static type semiconductor memory device (to be referred to as an "SRAM" hereinafter) is widely utilized to store data required in such a portable appliance. This is because the portable appliance is generally operated by a battery built therein and the SRAM has such a merit that the data can be saved with low power consumption in a non-operating state of the portable appliance. Therefore, the SRAM is convenient for a long time operation. As a consequence, in order that the battery-operated portable appliance can be operated for longer time, it is strongly needed that the SRAM can be operated with a lower drive voltage and with a lower current consumption.

As a low power consumption type SRAM in which the need to reduce current consumption of such an SRAM in a standby mode is realized, there is known a full CMOS cell type SRAM which is composed of a P-channel transistor and an N-channel transistor, and a TFT (Thin-Film Transistor) cell type SRAM. However, in the full CMOS cell type SRAM, since the P-channel transistor and the N-channel transistors are both used, the chip size is increased. Also, in the TFT cell type SRAM, a polysilicon layer manufacturing step is further increased in an SRAM using a high resistance load type memory cell. Accordingly, the higher manufacturing cost is required in both the full CMOS cell type SRAM and the TFT cell type SRAM.

In an SRAM device having a memory capacity of approximately 1 Mbits, a high resistance load type cell is generally used. In addition, a resistance value of the high resistance polysilicon layer is increased such that data holding current flowing through the high resistance load type cell can be decreased as much as possible.

Also, for the need of lowering a drive voltage, read/write operations of the SRAM device are realized with a low voltage. In addition, a data holding mode is employed in a standby state to hold the written data in a voltage lower than the normal drive voltage (e.g., 2 V listed in catalog). As a result, the written data can be guaranteed. As a result, power consumption of the SRAM device in an non-operating state can be reduced.

The circuit structure of The above-described conventional SRAM device is described in, for example, Japanese Laid-open Patent Application (JP-A-Showa 63-282992) and Japanese Laid-open Patent Application (JP-A-Heisei 3-156795). The circuit structure of the SRAM device will now be described with reference to a circuit block diagram shown in FIG. 1A and a circuit structure of a memory section thereof shown in FIG. 1B.

That is, FIG. 1A shows a circuit structure of an SRAM device with employment of high resistance load type memory cells 10, in which (m×n) high resistance load type memory cells 10 are driven by "m" of word lines WL1, WL2, ... made of polysilicon and by "n" digit (bit) line pairs DG1 and CDG1, DG2 and CDG2, ... A word decoder 13 inputs address signals A0 to An, and a control signal 21 to select one of these word lines WL1, WL2, ... Also, the control signal 21 is amplified by a buffer logic circuit 19 and the amplified control signal 21 is supplied to a dummy word line DWL1. A signal derived from this dummy word line DWL1 is supplied via a word line voltage boosting circuit 12 to the word decoder 13.

Each of the high resistance load type memory cells 10 is connected to a corresponding one of the word lines WL1, WL2, ... Also, each of the high resistance load type memory cells 10 is connected to a corresponding pair of the bit line pairs DG1, CDG1: DG2, CDG2, ... As shown in FIG. 1B, each of these high resistance load type memory cells 10 is composed of memory cell driving MOS transistor QD1 and QD2, transfer transistors QT1 and QT2 for the memory cell, and load resistors R.

FIGS. 2, 3A, 3B, 4A and 4B show waveform diagrams for explaining operations of the high resistance load type memory cell 10. That is, FIG. 2 shows an operation waveform diagram of the high resistance load type memory cell 10 when the operation state of this memory cell 10 is changed from the actual use state to the data holding state, and from the data holding mode to the actual use state. FIGS. 3A and 3B show internal operation waveform diagrams of the high resistance load type memory cell 10 in T seconds (i.e., time described in catalog and shown in FIG. 2) when the data read operation is carried out after the operation state of the memory cell 10 is changed from the data holding state to the actual use state. FIGS. 4A and 4B show operation waveform diagrams of data holding nodes "a" and "b" in the high resistance load type memory cell 10 when α ray is irradiated.

Referring now to FIG. 2, a description will be made of operations of the data holding nodes "a" and "b" of the high resistance load type memory cell 10 when the operation of this memory cell 10 is changed between the actual use state and the data holding state. Since the potential level of the word line is the ground level in the data holding state. When the voltage for the memory cell is changed between the voltage VCC in the actual use state and the voltage VDR in the data holding state, the potential at the high level side output node "a" is changed in accordance with the time constant, which is determined based on the resistance value of the high resistor element R and the load capacitance of the node "a".

It is now assumed that the operation of the memory cell 10 is changed from the data holding state to the actual use state. Also, it is assumed that the potential of the word line WL1 selected based on the address signals A0 to An is changed to the boosted word line voltage after the time T described in the catalog and then the read operation is carried out. In this case, the operation when the potential at the word line is not yet increased will now be described more in detail with reference to FIG. 3A and the operation when the potential at word line is still increased will now be described more in detail with reference to FIG. 3B.

As shown in FIG. 3A, in the case where the potential at the word line is not yet increased, the transfer transistor QT1 is not brought into the ON state, so that there is no change in the potential at the node "a". This is because the potential difference between the potential at the node "a" and the power supply voltage VCC in the actual use state is lower than the threshold voltage of the transfer transistor QT1. On the contrary, since the transfer transistor QT2 is brought into the ON state, the electric charges which have stored in the load of the bit line CDG1 will flow into the node "b". At this time, since the potential at the node "a" is low, the current ability of the drive MOS transistor QD2 using the potential at the node "a" as the gate potential is low. As a consequence, the potential at the node "b" is increased. Accordingly, the drive transistor QD1 is brought into the ON state so that there is no potential difference between the node "a" and the node "b". The potentials at the nodes "a" and "b" are inverted by a very small fluctuation in the current abilities of the drive transistors employed within the high resistance load type memory cell 10. As a result, the cell data would be destroyed.

However, as illustrated in FIG. 3B, in the case where the potential at the word line is boosted to the boosted voltage VBB higher than the threshold voltage of the transfer transistor QT1, both of the transfer transistors QT1 and QT2 are brought into the ON state. Accordingly, the electric charges will flow into the nodes "a" and "b" from the bit lines. As a result, the potential at the node "a" is increased. Even when the electric charge flows from the bit line into the node "b", the gate potential at the drive MOS transistor QD2 becomes high, so that the potential at the node "b" is not so increased. As a consequence, the data written into the high resistance load type memory cell 10 can be read without electrically destroying these written data.

In a 1-Mbit SRAM device having both of the above-described low current consumption operation mode and also a data holding mode, the low current consumption operation is realized by increasing the resistance value of the high resistance polysilicon layer in the high resistance load type memory cell 10. In this case, when the operation state of this memory cell 10 is changed from the data holding mode at the voltage of 2 V to the actual use state at the low operation voltage of 2.7 V, the long time period is required until a high level side output potential of this high resistance load type memory cell 10 is increased up to the power supply voltage in the actual use state. This is because the high level side output potential is applied via the high resistance load resistor. A high resistance load resistor element formed in a 1-Mbit SRAM device which is presently manufactured in mass production typically has the resistance value as high as 10 tera ohms, assuming that a consumed current in the standby state is selected to be on the order of 1 $\mu$A.

On the other hand, the chip size of the SRAM device is still reduced every year. At the same time, the mask pattern of a high resistance load resistor of the memory cell is also reduced. Also, the resistance value of the high resistance load resistor determined based on a dose amount of phosphorus ions into a polysilicon layer is largely fluctuated in a range of 8 to 18 tera ohms.

Here, assume that a diffusion layer capacitance of a drain of a memory cell driving transistor for holding cell data is selected to be on the order of 1.3 fF and a gate capacitance of another memory cell driving transistor of a flip-flop is selected to be on the order of 1.3 fF. In this case, a potential rising time period required until the drain node reaches from a voltage in the data holding state up to a power supply voltage in the actual state would become $(1.3 \times 10^{-15} + 1.3 \times 10^{-15}) \times (8 \text{ to } 18 \ 10^{12}) = 21 \text{ to } 47$ msec.

On the other hand, the wait time period described in the catalog is generally selected to be on the order of 5 msec. Therefore, the read operation would be carried out before the potential rising time period required when the high level side output potential of this high resistance load type memory cell 10 is increased to the power supply potential.

Now, the SRAM device is tried to be manufactured with lower cost, and as a result of this, the chip size of the SRAM device is reduced, as described above. Also, the cell size of the high resistance load type memory cell is reduced. Therefore, it becomes practically difficult to maintain a current ability ratio of a cell transfer transistor to a cell driver transistor, namely (the current ability of the cell driver transistor)/(the current ability of the cell transfer transistor). The larger this current ability ratio is increased, the better the current holding ability of the high resistance load type memory cell is increased. As a result, the potential difference between the high level side output potential of the high resistance load type memory cell and the low level side output potential thereof is lowered, so that the cell data would be destroyed.

As previously explained, the time period originally required to increase the potential of the word line is about 21 to 47 msec. If time period during which the potential of the word line is boosted becomes longer than this originally required time period, then the current ability of the cell transfer transistor is increased, so that the current ability ratio of this cell transfer transistor to the cell driver transistor is decreased. Therefore, there is another problem in that the $\alpha$-ray endurance amount would be lowered.

Next, operations of this high resistance load type memory cell when the $\alpha$-ray is irradiated will now be explained with reference to FIGS. 4A and 4B. That is, FIG. 4A illustrates operation of the memory cell 10 when the potential at the word line is not increased, whereas FIG. 4B shows operation of the memory cell 10 when the potential at the word line is increased, while the $\alpha$-ray is irradiated. When the potential at the word line is increased, the gate voltages of the transfer transistors QT1 and QT2 are increased. Accordingly, the current abilities thereof are increased. However, when one word line is selected and the potential at this word line becomes the high level, the potential at the node "b" on the low level side of the cell data is increased in the case where the potential at the word line is increased as shown FIG. 4B than in the case where the potential at the word line is not increased as shown FIG. 4A. In this case, if the $\alpha$-ray is irradiated at time to, the potential drop may easily occur in the node "a" at the high level potential when the potential at the node "b" is high. This is because the above-described current ability ratio of the transfer transistor QT1 to the driver transistor QD1 is lowered. Accordingly, the cell data would be readily destroyed.

As described above, the word line voltage is desirably boosted in the data read operation in the SRAM device. However, if the read/write operation of the SRAM device is waited until the high level side output potential reaches the power supply potential, there is another problem in that the operation of an overall system would be delayed. Also, if the word line voltage is boosted for too long time, the $\alpha$-ray endurance would be lowered. Therefore, the word line voltage boosting operation should be stopped after a predetermined time period.

To avoid the problems, the conventional circuit shown in FIG. 1 is proposed to control the time period required to boost the potential at the word line. In this conventional time control circuit, the word line voltage boosting circuit 12 is driven using the dummy word line DWL1 until the boosted potential at the dummy word line DWL1 becomes the power supply voltage. Thus, the dummy word line DWL1 is employed so as to confirm that any one of the word lines is selected.

As previously described, the time period originally required to increase the potential at the word line is about 21 to 47 msec. However, in the conventional circuit in which the word line voltage boosting circuit 12 is driven using the dummy word line DWL1, it is practically difficult to produce such long delay time with high precision.

Also, it is difficult to realize such a long delay time by a delay circuit composed of inverters. In other words, even when this inverter type delay circuit is constituted under the worst condition, the normal operation speed of an SRAM device is selected to be on the order of "nsec" (nanosecond). On the other hand, when this inverter type delay circuit is constituted of inverters, a large number of inverter elements are necessarily required, because the operation speed on the order of "msec" (millisecond) is longer than "nsec" by 6 digits. As a consequence, the chip area is increased, and further the higher cost is required. Thus, it is practically impossible to construct such a long time delay circuit of inverters.

Further, it is extremely difficult to produce a timer circuit composed of a resistor R and a capacitor C such that the delay time is adjusted so as to be fitted to the high resistance value of the high resistance load type memory cell. This is because the high resistance value would be fluctuated by the manufacturing condition. That is, the resistance value of the high resistor element is largely changed by the manufacturing condition of polysilicon. In addition, the number of high resistance elements is 2 million in a 1-Mbit high resistance load type SRAM. Therefore, fluctuations in these resistance values are considerably increased.

An SRAM device is disclosed in, for instance, Japanese Laid-open Patent Application (JP-A-Heisei 5-6675), in which the word line voltage boosting circuit is used to realize the write operation with a low voltage. In this conventional example, the high level side output potential of a high resistance load type memory cell is applied from a bit line by a word line voltage boosting circuit in the write operation. As a result, a large potential differences is given between the high level side output potential of the high resistance load type memory cell and also to the low level side output potential thereof. However, the boosting operation is performed only to the write operation.

SUMMARY OF THE INVENTION

The present invention has been made to solve these problems in the conventional static type semiconductor memory devices. Therefore, an object of the present invention is to provide a static type semiconductor memory device in which a delay time of 26 msec to 47 msec cam be produced in a simple delay time circuit with higher precision.

In order to achieve an aspect of the present invention, a static type semiconductor memory device includes a word decoder connected to a plurality of word lines, for decoding an address signal to select one of the plurality of word lines, a resistor load type memory cell connected to the selected word line, wherein the resistor load type memory cell comprises two pairs of a load resistor and a MOS transistor, the two pairs being connected to form a flip-flop, a word line voltage boosting circuit connected to the word decoder, for boosting a voltage of the selected word line to a voltage higher than a power supply voltage in response to a boost control signal, and a timer circuit including a replica of the load transistor of one of the two pair and a replica of the MOS transistors of the two pair, for generating the boost control signal for a predetermined time period in response to a start control signal to activate the word line voltage boosting circuit.

The timer circuit includes a comparing circuit section for comparing a voltage of one terminal of the replica of the load resistor and a voltage of one terminal of a reference resistor, wherein the other terminal of the replica of the load resistor is connected to a first voltage and the other terminal of the reference resistor is connected to a second voltage lower than the first voltage, and wherein a resistance of the reference resistor is smaller than that of the replica of the load resistor.

In this case, the comparing circuit section includes a pair of N-channel transistors and another N-channel transistor connected to the pair of N-channel transistors functioning as a constant current source. One of the N-channel transistors is the replica of one of the MOS transistors and the gate of the one N-channel transistor is connected to the replica of the load resistor.

In this case, the timer circuit includes the comparing circuit section, an output circuit section for outputting the boost control signal based on the comparing result of the comparing circuit section, and an output control circuit section for controlling connection between the comparing circuit section and the output circuit section in response to the start control signal. The output circuit section includes a current mirror circuit.

The timer circuit may be composed of a first N-channel transistor whose source is connected to the ground, a chip select signal as the start control signal being supplied to a gate of the first N-channel transistor, a first P-channel transistor, a second N-channel transistor and a third N-channel transistor as the replica of one of the MOS transistors connected in series between the power supply voltage and a drain of the first N-channel transistor, a second P-channel transistor, a fourth N-channel transistor and a fifth N-channel transistor connected in series between the power supply voltage and the drain of the first N-channel transistor, wherein gates of the first and second P-channel transistors are connected in common to a node between the second P-channel transistor and the fourth N-channel transistor, and gates of the second and fourth N-channel transistors are connected to the chip select signal, an inverter connected to a node between the first P-channel transistor and the second N-channel transistor to output the boost control signal, a timer resistor, as the replica of the load resistor, connected between the gate of the third N-channel transistor and the power supply voltage, and a reference voltage generating circuit connected to a gate of the fifth N-channel transistor.

In this case, it is desirable that the replica of the load resistor and the load resistor are formed at same processes, and the replica of one of the MOS transistors and the third N-channel transistor have are formed at same processes. Also, desirably, patterns of the replica of the load resistor and patterns of the third N-channel transistor are substantially the same as patterns of the load resistor of one of the pairs and patterns of the MOS transistor of the other of the pairs, in the resistor load type memory cell, respectively.

The timer circuit includes a first N-channel transistor whose source is connected to the ground, a chip select signal as the start control signal being supplied to a gate of the first N-channel transistor, a first P-channel transistor, a second N-channel transistor and a third N-channel transistor as the replica of one of the MOS transistors connected in series between the power supply voltage and a drain of the first N-channel transistor, a second P-channel transistor, a fourth N-channel transistor and a fifth N-channel transistor connected in series between the power supply voltage and the drain of the first N-channel transistor, wherein gates of the first and second P-channel transistors are connected in common to the ground, and gates of the second and fourth N-channel transistors are connected to the chip select signal, an inverter connected to a node between the first P-channel transistor and the second N-channel transistor to output the boost control signal, a timer resistor as the replica of the load resistor connected between the gate of the third N-channel transistor and the power supply voltage, and a reference voltage generating circuit connected to a gate of the fifth N-channel transistor.

In this case, it is desirable that the timer resistor and the third N-channel transistor have substantially the same dimensions as those of the load resistor of one of the pairs and those of the MOS transistor of the other of the pairs. Also, desirably, patterns of the timer resistor and patterns of the third N-channel transistor are substantially the same as those of the load resistor of one of the pairs and the MOS transistor of the other of the pairs, respectively, and the timer resistor and the load resistor of one of the pairs the third N-channel transistor, and the third N-channel transistor and the MOS transistor of the other of the pairs are formed the same processes.

The predetermined time period is substantially the same as a time period for which an output of the flip-flop on a high level side rises to the power supply voltage.

In order to achieve another aspect of the present invention, a static type semiconductor memory device includes a word decoder connected to a plurality of word lines, for decoding an address signal to select one of the plurality of word lines, a plurality of resistor load type memory cells connected to the plurality of word lines, a word line voltage boosting circuit connected to the word decoder, for boosting a voltage of the selected word line to a voltage higher than a power supply voltage in response to an entire boost control signal, and a timer circuit section for generating the entire boost control signal for a predetermined time period in response to a start control signal to activate the word line voltage boosting circuit.

The timer circuit section may includes a plurality of timer circuits provided for ones of the plurality of resistor load type memory cells, wherein each of the plurality of timer circuits generates a boost control signal for an individual predetermined time period in response to the start control signal, and a logical product circuit for generating the entire boost control signal from the boost control signal from each of the plurality of resistor load type memory cells.

Alternatively, the timer circuit section may includes a current mirror circuit, an inverter connected to the current mirror circuit to output the boost control signal, a plurality of circuit sections provided for ones of the plurality of resistor load type memory cells, a first N-channel transistor connected to the plurality of circuit sections at a drain thereof and connected to the ground at a source thereof, a gate of the first N-channel transistor being connected to a chip select signal as the start control signal, and a voltage dividing circuit. In this case, each of the plurality of circuit sections includes a second N-channel transistor and a third N-channel transistor connected in series between the current mirror circuit and the drain of the first N-channel transistor, a fourth N-channel transistor and a fifth N-channel transistor connected in series between the current mirror circuit and the drain of the first N-channel transistor. Also, gates of the second and fourth N-channel transistors are connected to the chip select signal, and a gate of the fifth N-channel transistor is connected to the voltage dividing circuit, and a timer resistor connected between the gate of the third N-channel transistor and the power supply voltage. In addition, the resistor load type memory cell corresponding to the circuit section comprises two pairs of a load resistor and a MOS transistor, the two pairs are connected to form a flip-flop, and the timer resistor and the third N-channel transistor are replicas of the resistor of one of the pairs and that of the MOS transistor of the other of the pairs.

BRIEF DESCRIPTION OF THE DRAWINGS

The present invention could be better understood in conjunction with the specification with reference to the following drawings.

DESCRIPTION OF THE PREFERRED EMBODIMENTS

A static type semiconductor memory device of the present invention will be described below in detail with reference to the accompanying drawings.

Figure 5A:
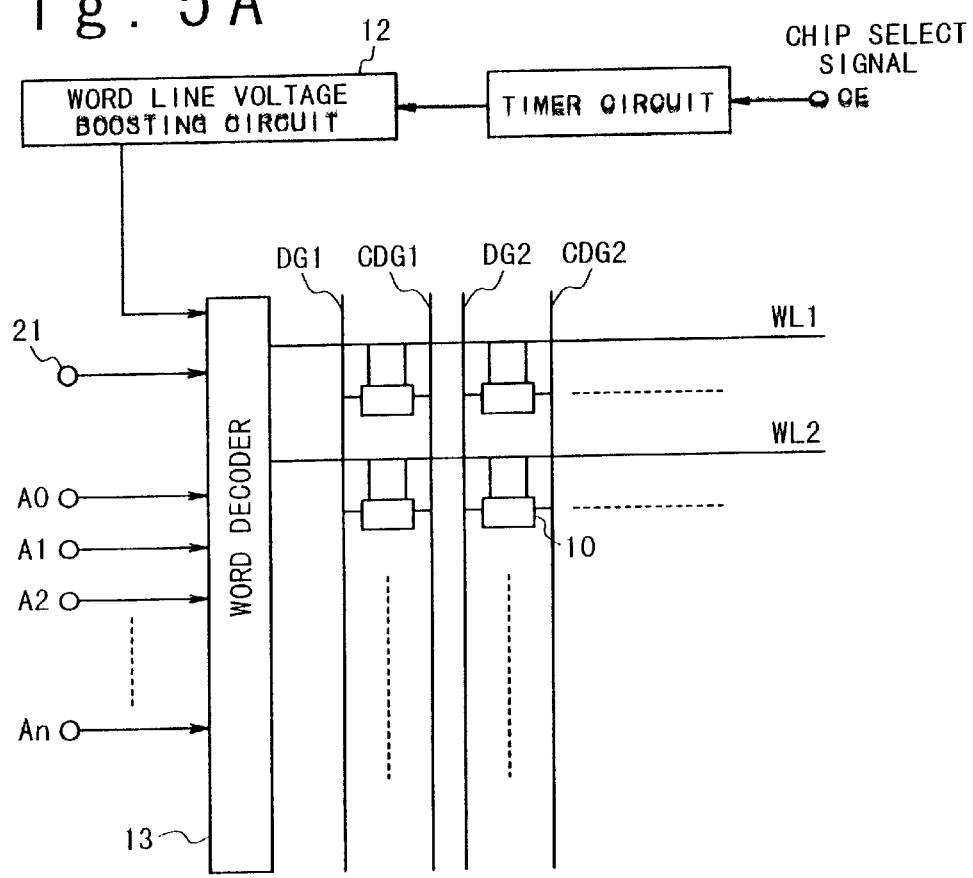
FIG. 5A is a block diagram for illustrating the circuit structure of a static type semiconductor memory device such as an SRAM device using a timer circuit according to an embodiment of the present invention.
Figure 5B:
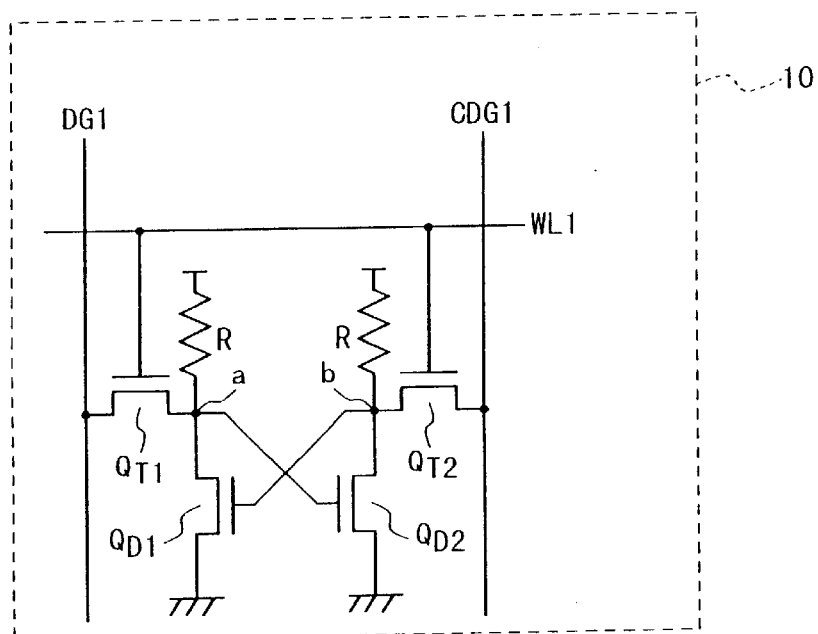
FIG. 5B is a circuit diagram for illustrating a memory cell section of this SRAM device shown in FIG. 5A.

First the static type semiconductor memory device such as an SRAM (Static Random Access Memory) device according to the first embodiment of the present invention will be described. FIG. 5A is a schematic block diagram for illustrating an SRAM device with employment of a timer circuit according to an embodiment of the present invention. FIG. 5B is a circuit diagram of a memory cell section of this SRAM device shown in FIG. 5A. Referring to FIG. 5A, the SRAM device is composed of a timer circuit 11, a word line voltage boosting circuit 12, a word decoder 13, and a memory cell array.

The memory cell array is composed of (m×n) high resistance load type memory cells 10. The memory cells 10 are connected to "m" word lines WL1, WL2, . . . made of polysilicon and to "n" digit (bit) line pairs DG1 and CDG1, DG2 and CDG2, . . . , respectively. The timer circuit 11 inputs a chip select signal CE to output a timing control signal to the word line voltage boosting circuit 12. The word decoder 13 inputs address signals A0 to An, and a control signal 21 to select one of these word lines WL1, WL2, . . . The word line voltage boosting circuit 12 generates a voltage higher than a power supply voltage in response to the timing control signal from the timer circuit 11 and supplies the boosted voltage to the word decoder 13. Thus, the voltage of the selected word line is set to the boosted voltage.

Figure 1A:
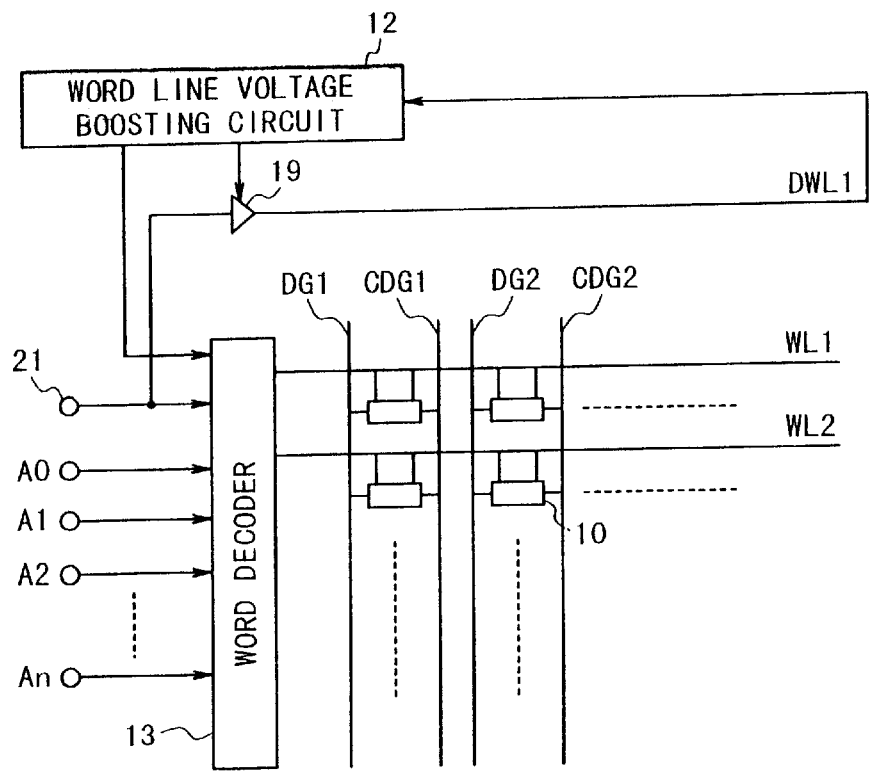
FIG. 1A is a block diagram for illustrating the circuit structure of a conventional SRAM.
Figure 1B:
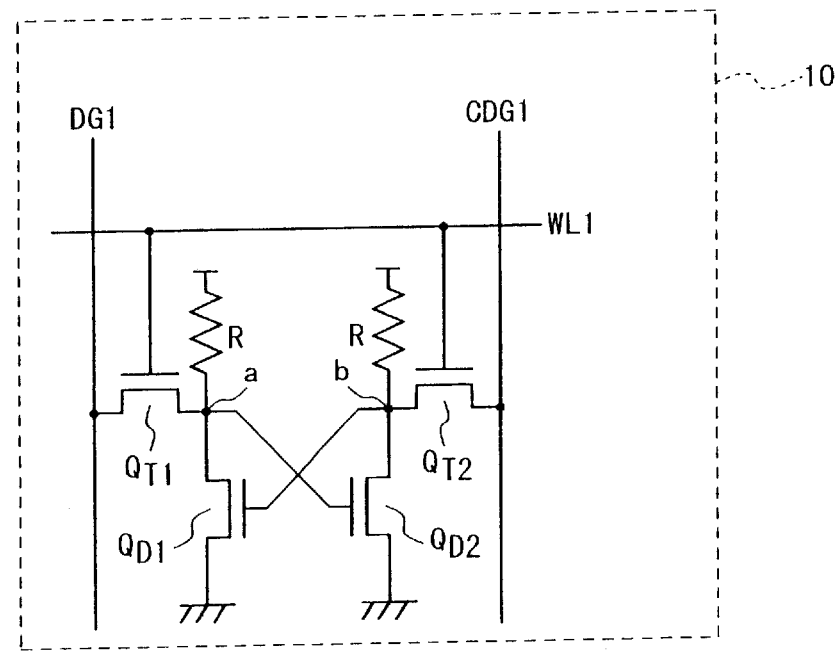
FIG. 1B is a circuit structure of a high resistance load resistor type memory cell section of the SRAM.
Figure 2:
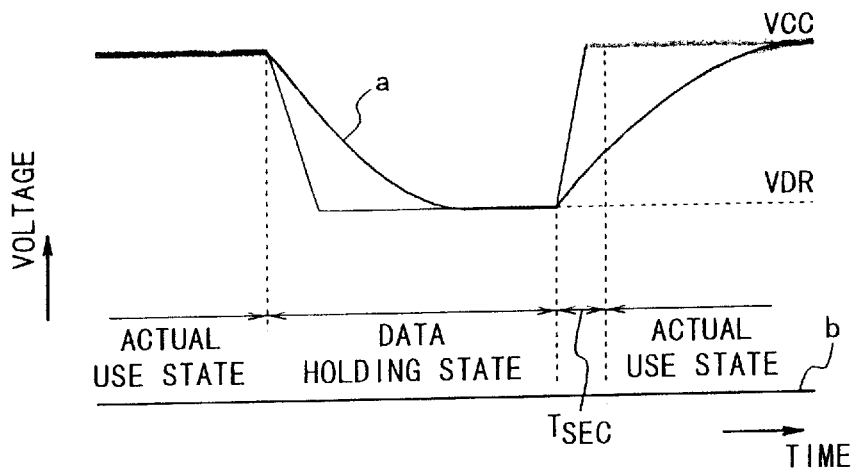
FIG. 2 is an operation waveform diagram for explaining the operation of the conventional SRAM circuit shown in FIG. 1.
Figure 3A:
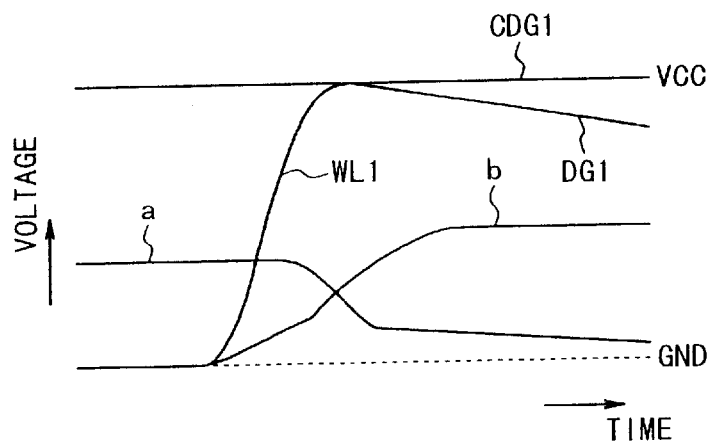
FIG. 3A and FIG. 3B are waveform diagrams for explaining the operation of the conventional SRAM circuit shown in FIG. 1.
Figure 3B:
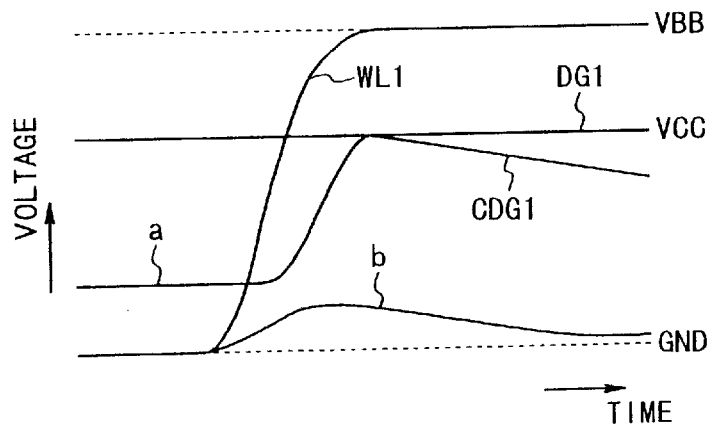
Figures 4A, 4B:
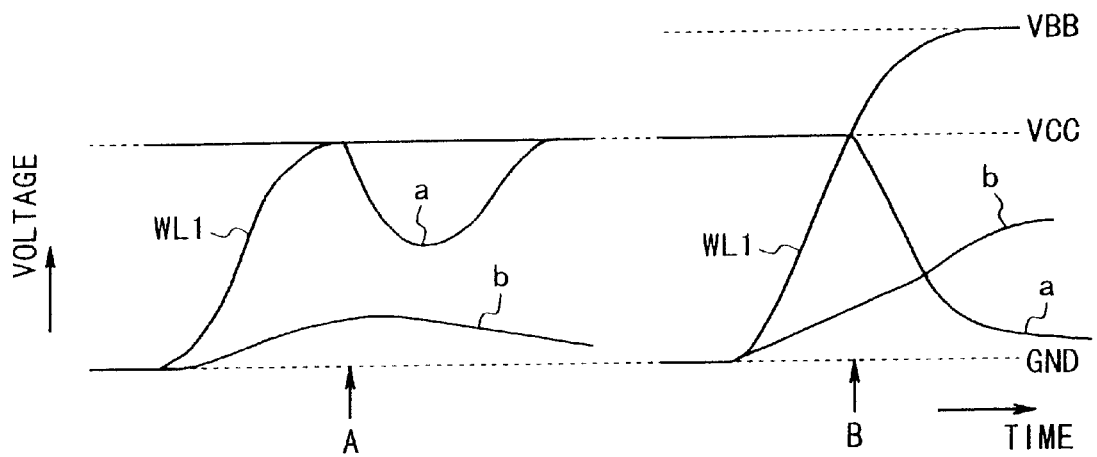
FIGS. 4A and 4B are other waveform diagrams for explaining the operation of the conventional SRAM circuit shown in FIG. 1 when α-ray is irradiated.

As seen from FIG. 5A, in the first embodiment, the word line boosting circuit 12 is connected to the timer circuit 11, instead of the dummy word line DWL1 employed in the conventional SRAM of FIG. 1A.

As shown in FIG. 5B, the high resistance load memory cell 10 is composed of driving MOS transistors QD1 and QD2, transfer MOS transistors QT1 and QT2, and load resistors R. The driving transistors QD1 and QD2 are connected to the power supply voltage via the high resistance load resistors R, respectively, and connected each other in a cross connection manner to form a flip-flop. The transfer transistors QT1 and QT2 are connected between the bit lines DG1 and CDG1 and the node "a" between the transistor QD1 and the resistor R and the node "b" between the transistor QD2 and the resistor R, respectively. The gates of the transfer transistors QT1 and QT2 are connected to the word line WL1, for example. It should be understood that the circuit structure of the high resistance load memory cell 10 is the same as that of the conventional high resistance load resistor type memory cell.

Figure 6:
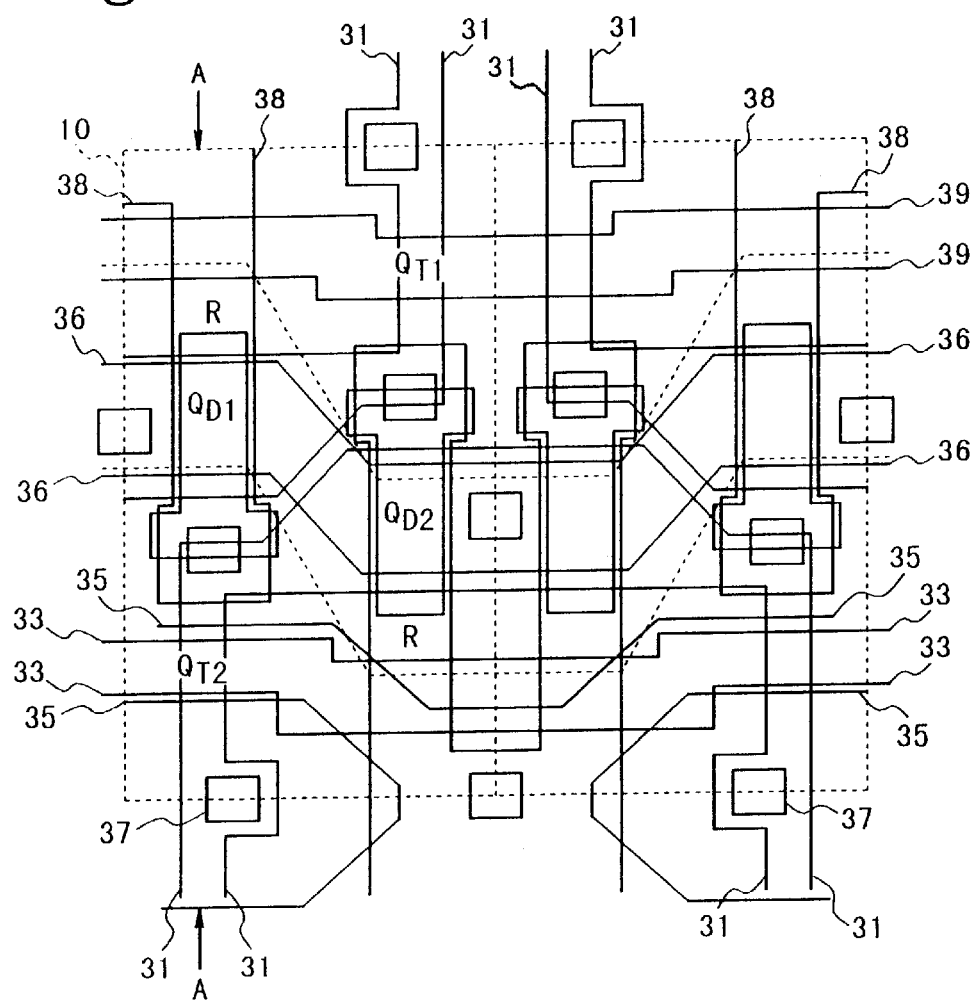
FIG. 6 shows a mask pattern diagram of a high resistance load memory cell section illustrated in FIG. 5B.

The plan view mask pattern of a portion of this high resistance load resistor type memory cell 10 is illustrated in FIG. 6. The cross section along the line A—A in FIG. 6 is shown in FIG. 7.

Figure 7:
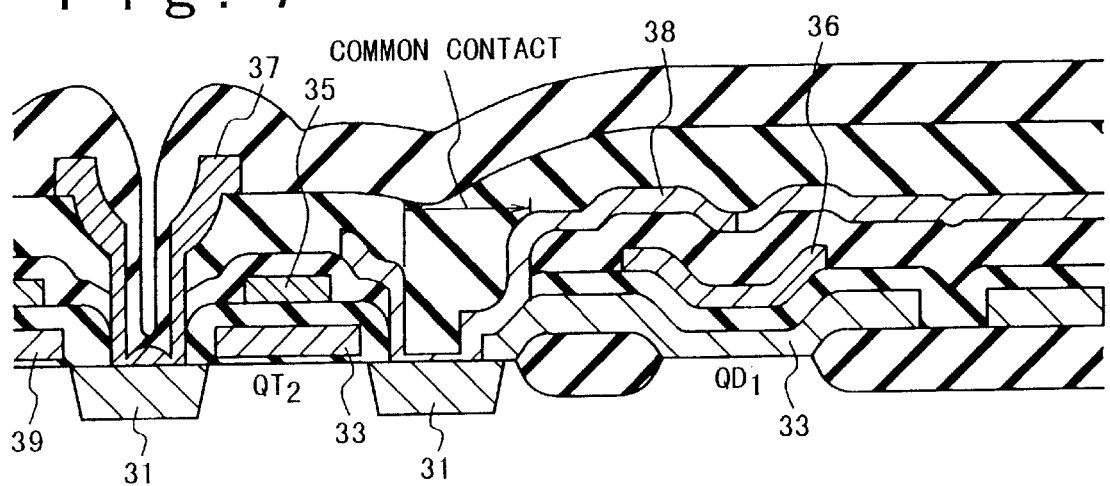
FIG. 7 is a sectional view of the high resistance load memory cell section shown in FIG. 6 when it is cut along the line A—A.

As shown in FIGS. 6 and 7, in this mask pattern, diffusion layers 31 and 32 are formed on a semiconductor substrate. Gate polysilicon layers 33 are formed via a gate insulating layer on these diffusion layers 31 and 32. Second polysilicon layers 35 are formed via another insulating layer on these gate polysilicon 33. A diffusion layer aluminium contact 37 is formed between these second polysilicon 35.

Figure 8:
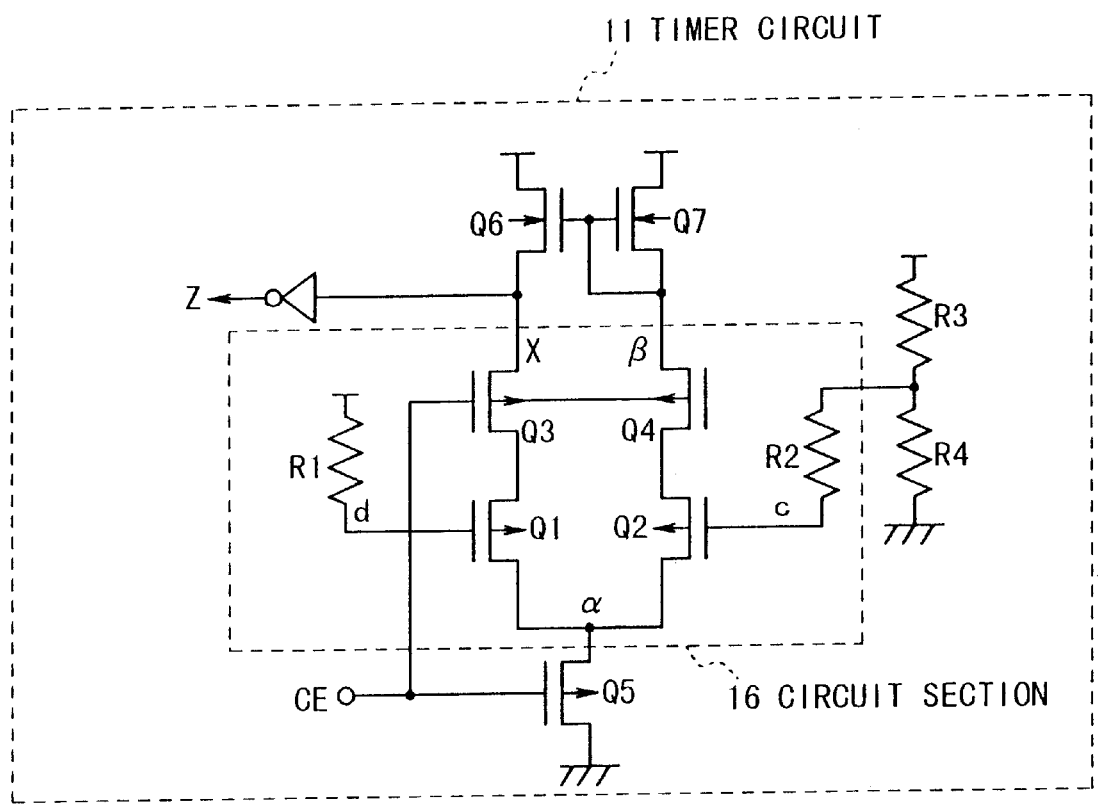
FIG. 8 is a circuit structure for illustrating an example of the timer circuit shown in FIG. 5A.

FIG. 8 is a circuit diagram of the above-described timer circuit 11 shown in FIG. 5A. As shown in FIG. 8, this timer circuit 11 is a current mirror type sense amplifier, and is composed of N-channel MOS transistors Q1 to Q5, P-channel MOS transistors Q6 and Q7, and resistor elements R1 to R4.

The MOS transistors Q6, Q3 and Q1 are connected in series from the power supply voltage and the MOS transistors Q7, Q4 and Q2 are connected in series from the power supply voltage. The sources of the MOS transistors Q1 and Q2 are connected to the drain of the MOS transistor Q5 at a node α and the source of the MOS transistor Q5 is connected to the ground.

The gate of the N-channel MOS transistor Q1 as a node "d" is connected to the power supply voltage via the first resistor element R1 having a high resistance value (on the order of 10 tera ohms). Also, the gate of the N-channel MOS transistor Q2 as a node "c" is connected via the second resistor element R2 having a low resistance value (on the order of 1 MΩ) to a node between the resistor elements R3 and R4 of a dividing circuit connected between the power supply voltage and the ground. Thus, a comparing circuit is formed of the MOS transistors Q1, Q2 and Q5 and the resistors R1 to R4.

The gates of the MOS transistors Q6 and Q7 as a load circuit are connected each other and connected to the drain of the MOS transistor Q4 as a node β to form a mirror circuit. The drain of the MOS transistor Q3 as a node X is connected to an inverter 17. The output of the inverter 17 is supplied to the word line voltage boosting circuit 12 as the timing control signal.

The chip select signal CE is supplied to the gates of the MOS transistors Q3, Q4 and Q5.

In this manner, the transistors Q3 and Q4 are turned ON/OFF in response to the chip select signal CE, and the comparing circuit is connected to the load transistors Q6 and Q7 as the mirror circuit.

Figure 9:
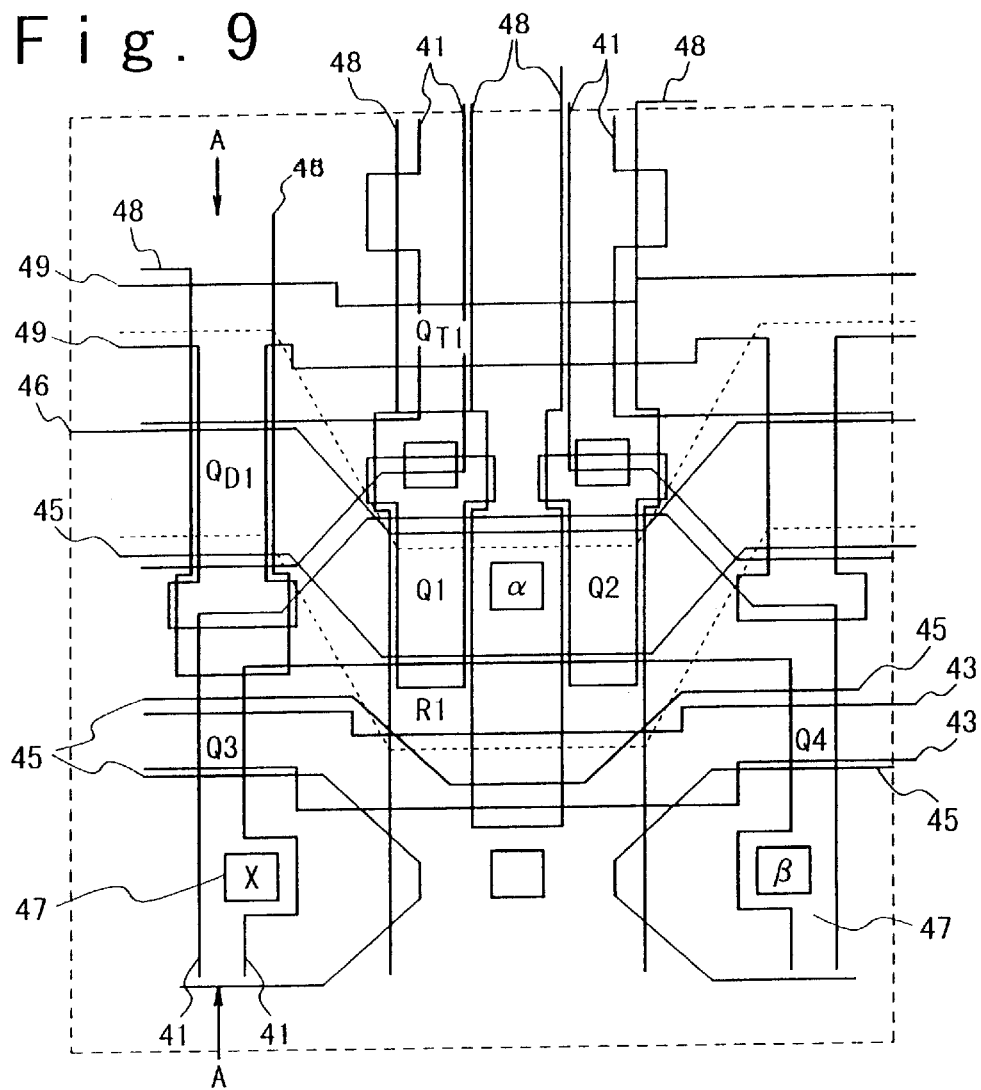
FIG. 9 is a mask pattern diagram for illustrating a portion of the timer circuit of FIG. 5A.
Figure 10:
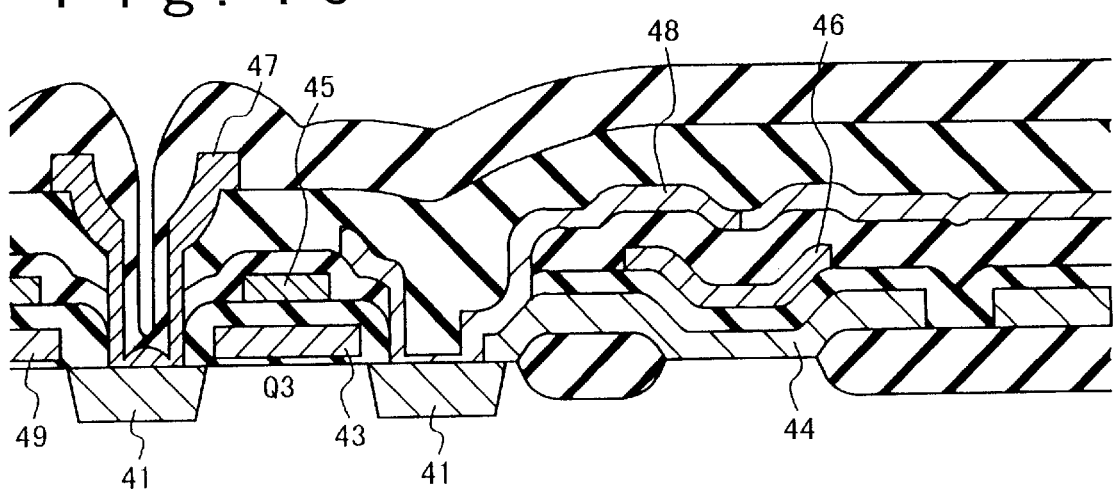
FIG. 10 is a sectional view for illustrating the portion of the timer circuit shown in FIG. 9 when it is cut along the line B—B.

FIG. 9 shows a mask pattern diagram of a portion of the above-described timer circuit 11 illustrated in FIG. 8. FIG. 10 is a sectional view for illustrating the cross section along the line B—B in the portion of the timer circuit 11. This mask pattern is so arranged as illustrated in FIG. 9.

The MOS transistors Q1 and Q3 are replicas of the MOS transistors QD2 and QT2. Patterns for the MOS transistor QD1 are remained and the gate of the MOS transistor QD1 is connected to the gate of the MOS transistor QT1 to prevent that the MOS transistor QD1 is in the floating state. As a result, the drain capacitance and the gate capacitance are effective in the timer circuit 11.

A circuit section 16 of the timer circuit 11 includes the comparing circuit whose mask pattern is similar to that of the high resistance load resistor type memory cell 10 shown in FIG. 5B. As a consequence, this timer circuit 11 has a feature that a portion of the mask pattern of the high resistance load resistor type memory cell 10 shown in FIG. 6 can be utilized as it is as replicas.

Similar to FIG. 6, the structure of this resembled portion shown in FIG. 10 is constructed in such a manner that diffusion layers 41 and 42 are provided on a semiconductor substrate. Gate electrodes 43 and 44 made of polysilicon are formed via an insulating layer on these diffusion layers 41 and 42. Second polysilicon layers 45 and 46 are formed via another insulating layer on these polysilicon gate electrodes 43 and 44. Also, a diffusion layer aluminium node 47 is formed between these second polysilicon layers 45.

In the mask pattern of a portion of the above-explained timer circuit 11 shown in FIG. 9, the patterns corresponding to the high resistor element R, the cell driver transistor QD2, and the cell transfer transistor QT2 of the high resistance load resistor type memory cell 10 shown in FIG. 6 are used as the patterns corresponding to the resistor R1, and the N-channel MOS transistors Q1 and Q3 of the timer circuit 11 illustrated in FIG. 9. Also, the patterns corresponding to the cell driver transistor QD1 and the cell transfer transistor QT1 shown in FIG. 6 are connected to a gate electrode made of polysilicon and then is fixed on the ground, as illustrated in FIG. 9. With employment of such a structure, the load capacitance of the node "d" of FIG. 8 can be made equal to the load capacitance of the node "a" formed in the high resistance load memory cell 10.

Accordingly, when the voltage is changed from the voltage VDR to the voltage VCC, the voltage change of the node "d" shown in FIG. 8 may be made identical to change when the voltage at the node "a" in the high resistance load memory cell 10 reaches the voltage VCC. It should be understood that other N-channel MOS transistors Q2 and Q4 formed in the circuit section 16 illustrated in FIG. 8 may be formed by using the cell driver transistor and the cell transfer transistor of the high resistance load memory cell 10 of the cell array, which memory cell 10 is located adjacent to the circuit section 16, as represented in FIG. 7.

The node "d" shown in FIG. 8 is used as one input of the current mirror type sense amplifier. The node "c" is used as another input of the current mirror type sense amplifier to follow the power supply voltage change. A resistance value of this resistor element R2 is selected to be on the order of mega ohms so as to follow the power supply voltage. The resistor element is used in an opposite direction to the direction when the polysilicon layer is used as the high resistance polysilicon layer by implanting phosphorous ions. Also, other diffusion layers, polysilicon gate electrodes, and polysilicon layers functioning as resistor elements are left as a dummy circuit without any treatment.

The remaining transistors Q5 to Q7, resistor elements R3 and R4, and the inverter logic circuit 17 illustrated in FIG. 8 are formed in other places. Also, bit line aluminium wiring lines DG1 and DG2 utilized in the high resistance load memory cell 10 are used. In addition, a connection is accomplished using a second polysilicon layer which is used as the ground of the high resistance load resistor type memory cell 10 shown in FIG. 7.

Figure 11:
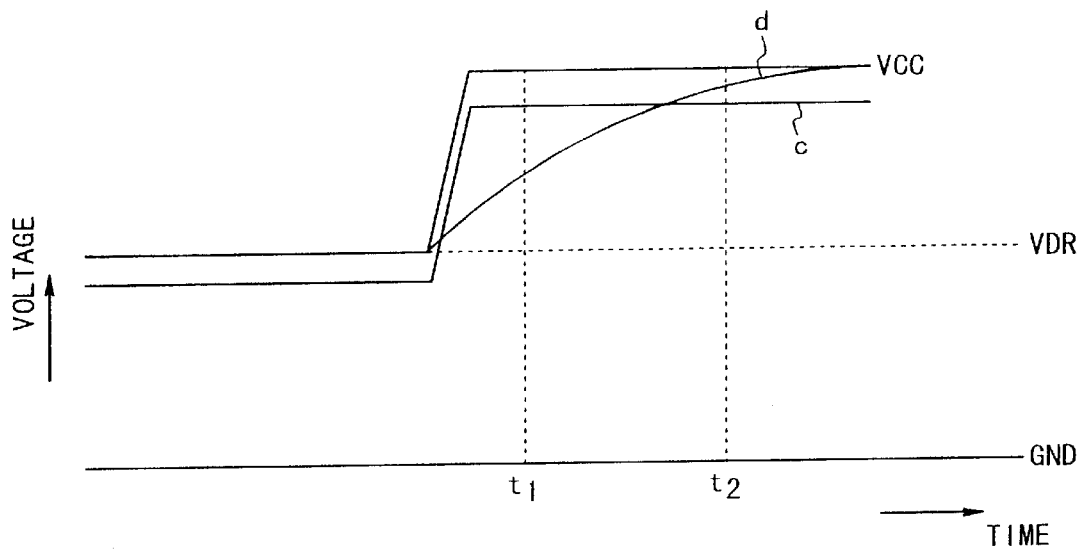
FIG. 11 is an operation waveform diagram for describing operation of the timer circuit shown in FIG. 5A.
Figures 12A, 12B:
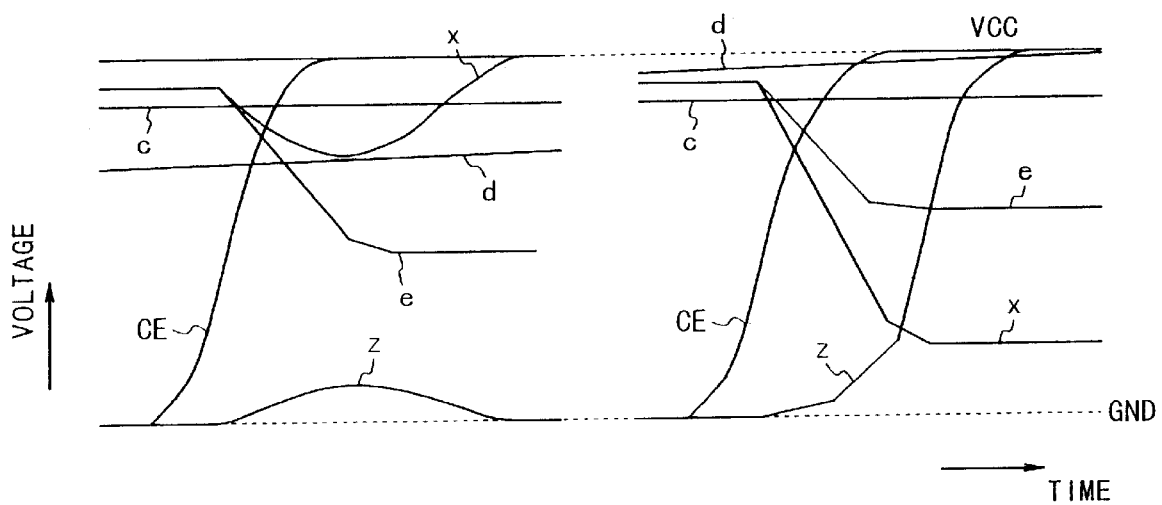
FIG. 12A and FIG. 12B are operation waveform diagrams for explaining operations of the timer circuit shown in FIG. 5A.

Referring now to operation waveform diagrams of FIGS. 11, 12A and 12B, a description will be made of operations of the timer circuit 11 according to this first embodiment. When the chip select signal CE is inputted to this timer circuit 11 (see time "t1" shown in FIG. 11) before the potential at the node "a" in the high resistance load memory cell 10 reaches the voltage VCC, the output "X" of the current mirror type sense amplifier becomes a high level potential, so that the logic output "Z" of the inverter 17 becomes a low level, since the potential at the node "d" is lower than the potential at the node "c", as shown in FIG. 12A. At this time, the word line voltage boosting circuit 12 operates to output a boosted voltage to the word decoder 13.

On the other hand, when the chip select signal CE is input to this timer circuit 11 after the potential at the node "a" has reached the voltage VCC (see time "t2" in FIG. 11), the node "X" becomes a low level so that the logic output "Z" of the inverter 17 becomes a high level, as represented in FIG. 12B. At this time, the word line voltage boosting circuit 12 is controlled not to operate based on the output "Z" of the inverter 17 as the timing control signal.

As a consequence, when the voltage of the memory cell is changed from the data holding state voltage VDR to the actual use state voltage VCC, the time period for which the word line voltage is required to be boosted can be calculated based on the CR time constant defined by the high resistor element of the high resistance load memory cell and the diffusion layer capacitance of the drain of the driving transistor on the high level side.

Therefore, as previously explained in this embodiment, the high resistor element of the high resistance load memory cell and the driving transistor thereof are used to form the timer circuit and used as the input portion for the sense amplifier without changing their shapes in the first embodiment. As a result, the operation of this sense amplifier can be made identical to the operation at the high level side node of the high resistance load memory cell.

Therefore, the SRAM device can be formed such that the word line voltage boosting circuit operates only for a time period during which the output "Z" of the timer circuit 11 becomes the low level. In this manner, the word line voltage boosting operation time can be set to be 26 to 47 msec.

Also, according to this first embodiment, the resistor elements of the timer circuit 11 are formed from the mask pattern completely identical to the shape of the high resistance load memory cell, or the mask exposure condition. Therefore, when the high resistance load resistor is formed to have either the maximum width or the minimum width, the resistor elements of the timer circuits are also formed to have either the maximum width or the minimum width.

Also, even if there is a fluctuation in the manufacturing condition such as the mask pattern exposure conditions, the phosphorus ion implantation amount and the polysilicon formation, the fluctuations of the high resistance load memory cell can also be reflected to the timer circuit 11.

Further, in a case where there is fluctuation in the resistance values of the high resistor elements, if a plurality of timer circuits are used or a plurality of sense amplifiers are used to have the same pattern shapes as those of the high resistance load memory cell, the optimal delay time fitted to the worst condition can be produced.

Also, the resistor element R of the high resistance load type memory cell 10 according to this first embodiment is made of polysilicon. The pattern of the resistor element R is fluctuated in width due to the fluctuations in the exposure condition of the mask pattern during the manufacturing steps. Therefore, the timer circuit 11 may be formed to include the resistor element R1 made of polysilicon which is form to have the same width as that of the resistor element R.

In this manner, the maximum fluctuation value of the time period for which the word line voltage is required to be boosted can be previously set.

Figure 13:
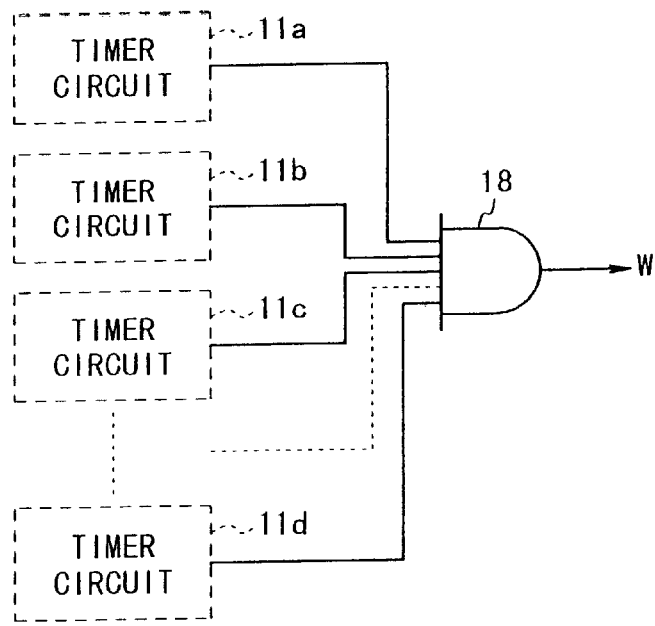
FIG. 13 is a schematic circuit diagram for showing an SRAM circuit containing a timer circuit section according to a second embodiment of the present invention.

FIG. 13 is a circuit diagram for partially illustrating a static type semiconductor memory device according to a second embodiment of the present invention. That is, as shown in FIG. 13, a timer circuit section is composed of a plurality of timer circuits 11a, 11b, . . . , 11n each of which is the same as the timer circuit shown in FIG. 8 and an AND gate circuit 18. The timer circuits 11a, 11b, . . . , 11n are provided for memory cells dispersed in the memory cell array. The outputs of all the timer circuits 11a, 11b, . . . , 11n are supplied to the AND gate circuit 18. As a consequence, when all of the outputs from the timer circuits 11a, 11b, . . . , 11n become high levels, the operation of the word line voltage boosting circuit 12 is stopped. Thus, the timer circuit section can be constituted, taking account for the worst condition.

Figure 14:
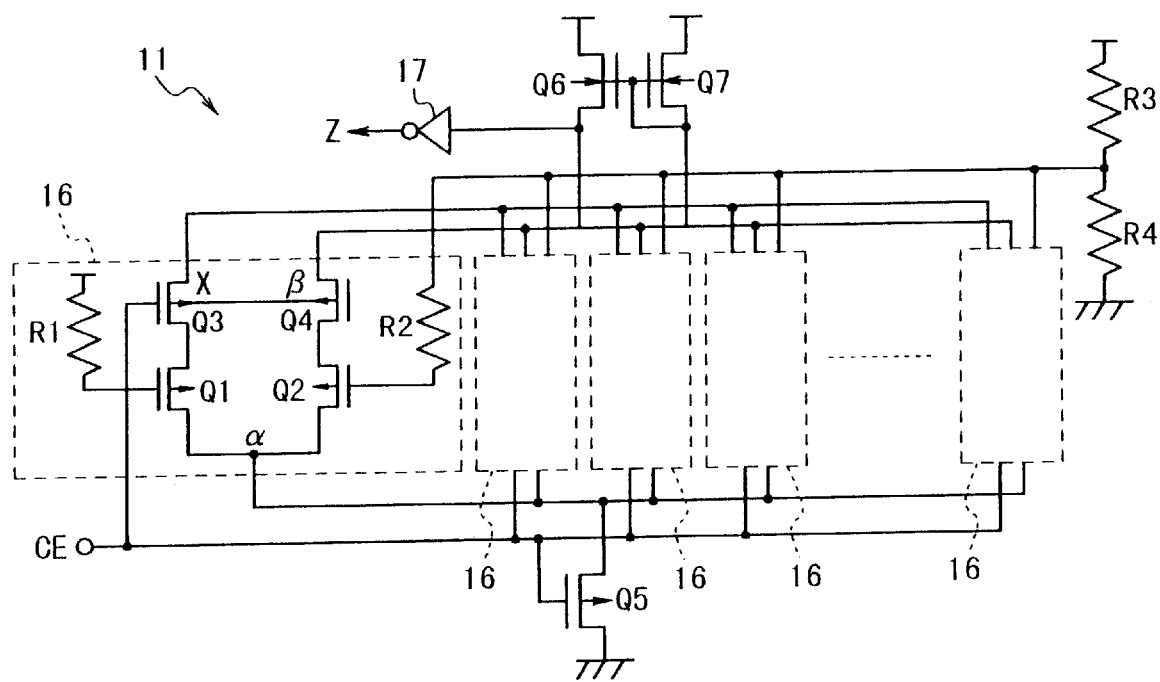
FIG. 14 is a schematic circuit diagram for representing an SRAM circuit containing a timer circuit section according to a third embodiment of the present invention.

Furthermore, FIG. 14 is a circuit diagram for partially showing a static type semiconductor device according to a third embodiment of the present invention. As shown in FIG. 14, circuit sections corresponding to a plurality of mask patterns for the high resistance load memory cell 10 are prepared, and these circuit sections are connected in parallel to each other so as to constitute a sense amplifier.

These circuit sections are provided for memory cells dispersed in the memory cell array. These circuit sections can be operated as shown in FIGS. 12A and 12B. Although the sense amplifier is designed as the current mirror type sense amplifier in these embodiments, a differential type sense amplifier may be alternatively arranged.

As previously described in detail, according to the present invention, the timer circuit or timer circuit section can be manufactured with the high precision such that the word line voltage boosting circuit is operated for a long delay time, e.g., approximately 26 to 47 msec, which is required when the potential at the high level side node of the high resistance load memory cell is increased up to the power supply potential. Also, there is another advantage in that the delay time fitted to the high resistor element used in the high resistance load memory cell, which is fluctuated by the manufacturing condition, can be produced in high precision.

What is claimed is:

1. A static type semiconductor memory device comprising:
   a word decoder connected to a plurality of word lines, for decoding an address signal to select one of the plurality of word lines;
   a resistor load type memory cell connected to said selected word line, wherein said resistor load type memory cell comprises two pairs of a load resistor and a MOS transistor, the two pairs being connected to form a flip-flop;
   a word line voltage boosting circuit connected to said word decoder, for boosting a voltage of said selected word line to a voltage higher than a power supply voltage in response to a boost control signal; and
   a timer circuit including a replica of said load transistor of one of the two pair and a replica of said MOS transistors of the two pair, for generating the boost control signal for a predetermined time period in response to a start control signal to activate said word line voltage boosting circuit.

2. A static type semiconductor memory device according to claim 1, wherein said timer circuit comprises a comparing circuit section for comparing a voltage of one terminal of said replica of said load resistor and a voltage of one terminal of a reference resistor, wherein the other terminal of said replica of said load resistor is connected to a first voltage and the other terminal of said reference resistor is connected to a second voltage lower than said first voltage, and wherein a resistance of said reference resistor is smaller than that of said replica of said load resistor.

3. A static type semiconductor memory device according to claim 2, wherein said comparing circuit section includes a pair of N-channel transistors and another N-channel transistor connected to the pair of N-channel transistors functioning as a constant current source, and
   wherein one of the N-channel transistors is said replica of one of said MOS transistors and the gate of said one N-channel transistor is connected to said replica of said load resistor.

4. A static type semiconductor memory device according to claim 3, wherein said timer circuit includes:
   said comparing circuit section;
   an output circuit section for outputting the boost control signal based on the comparing result of said comparing circuit section; and
   an output control circuit section for controlling connection between said comparing circuit section and said output circuit section in response to the start control signal.

5. A static type semiconductor memory device according to claim 4, wherein said output circuit section includes a current mirror circuit.

6. A static type semiconductor memory device according to claim 1, wherein said timer circuit comprises:
   a first N-channel transistor whose source is connected to the ground, a chip select signal as the start control signal being supplied to a gate of said first N-channel transistor;
   a first P-channel transistor, a second N-channel transistor and a third N-channel transistor as said replica of one of said MOS transistors connected in series between the power supply voltage and a drain of said first N-channel transistor;
   a second P-channel transistor, a fourth N-channel transistor and a fifth N-channel transistor connected in series between the power supply voltage and the drain of said first N-channel transistor;
   wherein gates of said first and second P-channel transistors are connected in common to a node between said second P-channel transistor and said fourth N-channel transistor, and gates of said second and fourth N-channel transistors are connected to the chip select signal;
   an inverter connected to a node between said first P-channel transistor and said second N-channel transistor to output the boost control signal;
   a timer resistor, as said replica of said load resistor, connected between the gate of said third N-channel transistor and the power supply voltage; and
   a reference voltage generating circuit connected to a gate of said fifth N-channel transistor.

7. A static type semiconductor memory device according to claim 6, wherein said replica of said load resistor and said load resistor are formed at same processes, and said replicas of said MOS transistors and said third N-channel transistor have are formed at same processes.

8. A static type semiconductor memory device according to claim 6, wherein patterns of said replica of said load resistor and patterns of said third N-channel transistor are substantially the same as patterns of the load resistor of one of the pairs and patterns of the MOS transistor of the other of the pairs, in said resistor load type memory cell, respectively.

9. A static type semiconductor memory device according to claim 1, wherein said timer circuit comprises:
   a first N-channel transistor whose source is connected to the ground, a chip select signal as the start control signal being supplied to a gate of said first N-channel transistor;
   a first P-channel transistor, a second N-channel transistor and a third N-channel transistor as said replica of one of said MOS transistors connected in series between the power supply voltage and a drain of said first N-channel transistor;
   a second P-channel transistor, a fourth N-channel transistor and a fifth N-channel transistor connected in series between the power supply voltage and the drain of said first N-channel transistor;
   wherein gates of said first and second P-channel transistors are connected in common to the ground, and gates of said second and fourth N-channel transistors are connected to the chip select signal;
   an inverter connected to a node between said first P-channel transistor and said second N-channel transistor to output the boost control signal;
   a timer resistor as said replica of said load resistor connected between the gate of said third N-channel transistor and the power supply voltage; and
   a reference voltage generating circuit connected to a gate of said fifth N-channel transistor.

10. A static type semiconductor memory device according to claim 9, wherein said timer resistor and said third N-channel transistor have substantially the same dimensions as those of the load resistor of one of the pairs and those of the MOS transistor of the other of the pairs.

11. A static type semiconductor memory device according to claim 10, wherein patterns of said timer resistor and patterns of said third N-channel transistor are substantially the same as those of the load resistor of one of the pairs and the MOS transistor of the other of the pairs, respectively, and said timer resistor and the load resistor of one of the pairs said third N-channel transistor, and said third N-channel transistor and the MOS transistor of the other of the pairs are formed the same processes.

12. A static type semiconductor memory device according to claim 1, wherein said predetermined time period is substantially the same as a time period for which an output of said flip-flop on a high level side rises to the power supply voltage.

13. A static type semiconductor memory device comprising:
   a word decoder connected to a plurality of word lines, for decoding an address signal to select one of the plurality of word lines;
   a plurality of resistor load type memory cells connected to said plurality of word lines;
   a word line voltage boosting circuit connected to said word decoder, for boosting a voltage of said selected word line to a voltage higher than a power supply voltage in response to an entire boost control signal; and
   a timer circuit section for generating the entire boost control signal for a predetermined time period in response to a start control signal to activate said word line voltage boosting circuit.

14. A static type semiconductor memory device according to claim 13, wherein said timer circuit section comprises:
   a plurality of timer circuits provided for ones of said plurality of resistor load type memory cells, wherein each of said plurality of timer circuits generates a boost control signal for an individual predetermined time period in response to the start control signal; and
   a logical product circuit for generating the entire boost control signal from the boost control signal from each of said plurality of resistor load type memory cells.

15. A static type semiconductor memory device according to claim 14, wherein each of said plurality of timer circuits comprises:
   a first N-channel transistor whose source is connected to the ground, a chip select signal as the start control signal being supplied to a gate of said first N-channel transistor;
   a first P-channel transistor, a second N-channel transistor and a third N-channel transistor connected in series between the power supply voltage and a drain of said first N-channel transistor;
   a second P-channel transistor, a fourth N-channel transistor and a fifth N-channel transistor connected in series between the power supply voltage and the drain of said first N-channel transistor;
   wherein gates of said first and second P-channel transistors are connected in common to a node between said second P-channel transistor and said fourth N-channel transistor, and gates of said second and fourth N-channel transistors are connected to the chip select signal;
   an inverter connected to a node between said first P-channel transistor and said second N-channel transistor to output the boost control signal;
   a timer resistor connected between the gate of said third N-channel transistor and the power supply voltage;
   a reference voltage generating circuit connected to a gate of said fifth N-channel transistor, and
   wherein said resistor load type memory cell corresponding to said timer circuit comprises two pairs of a load resistor and a MOS transistor, the two pairs are connected to form a flip-flop, and
   wherein said timer resistor and said third N-channel transistor are replicas of the resistor of one of the pairs and that of the MOS transistor of the other of the pairs.

16. A static type semiconductor memory device according to claim 14, wherein each of said plurality of timer circuits comprises:
   a first N-channel transistor whose source is connected to the ground, a chip select signal as the start control signal being supplied to a gate of said first N-channel transistor;
   a first P-channel transistor, a second N-channel transistor and a third N-channel transistor connected in series between the power supply voltage and a drain of said first N-channel transistor;
   a second P-channel transistor, a fourth N-channel transistor and a fifth N-channel transistor connected in series between the power supply voltage and the drain of said first N-channel transistor;
   wherein gates of said first and second P-channel transistors are connected in common to the ground, and gates of said second and fourth N-channel transistors are connected to the chip select signal;
   an inverter connected to a node between said first P-channel transistor and said second N-channel transistor to output the boost control signal;
   a timer resistor connected between the gate of said third N-channel transistor and the power supply voltage;
   a reference voltage generating circuit connected to a gate of said fifth N-channel transistor, and
   wherein said resistor load type memory cell corresponding to said timer circuit comprises two pairs of a load resistor and a MOS transistor, the two pairs are connected to form a flip-flop, and
   wherein said timer resistor and said third N-channel transistor are replicas of the resistor of one of the pairs and that of the MOS transistor of the other of the pairs.

17. A static type semiconductor memory device according to claim 13, wherein said timer circuit section comprises:
   a current mirror circuit;
   an inverter connected to said current mirror circuit to output said boost control signal;
   a plurality of circuit sections provided for ones of said plurality of resistor load type memory cells;
   a first N-channel transistor connected to said plurality of circuit sections at a drain thereof and connected to the ground at a source thereof, a gate of said first N-channel transistor being connected to a chip select signal as the start control signal; and
   a voltage dividing circuit, and
   wherein each of said plurality of circuit sections comprises:
   a second N-channel transistor and a third N-channel transistor connected in series between said current mirror circuit and the drain of said first N-channel transistor;
   a fourth N-channel transistor and a fifth N-channel transistor connected in series between said current mirror circuit and the drain of said first N-channel transistor;

wherein gates of said second and fourth N-channel transistors are connected to the chip select signal, and a gate of said fifth N-channel transistor is connected to said voltage dividing circuit; and a timer resistor connected between the gate of said third N-channel transistor and the power supply voltage, and wherein said resistor load type memory cell corresponding to said circuit section comprises two pairs of a load resistor and a MOS transistor, the two pairs are connected to form a flip-flop, and wherein said timer resistor and said third N-channel transistor are replicas of the resistor of one of the pairs and that of the MOS transistor of the other of the pairs.

18. A static type semiconductor memory device according to claim 13, wherein said timer circuit section comprises:

a current mirror circuit;

an inverter connected to said current mirror circuit to output said boost control signal;

a plurality of circuit sections provided for ones of said plurality of resistor load type memory cells;

a first N-channel transistor connected to said plurality of circuit sections at a drain thereof and connected to the ground at a source thereof, a gate of said first N-channel transistor being connected to a chip select signal as the start control signal; and a voltage dividing circuit, and wherein each of said plurality of circuit sections comprises:

a second N-channel transistor and a third N-channel transistor connected in series between said current mirror circuit and the drain of said first N-channel transistor;

a fourth N-channel transistor and a fifth N-channel transistor connected in series between said current mirror circuit and the drain of said first N-channel transistor;

wherein gates of said second and fourth N-channel transistors are connected to the chip select signal, and a gate of said fifth N-channel transistor is connected to said voltage dividing circuit; and a timer resistor connected between the gate of said third N-channel transistor and the power supply voltage, and wherein said resistor load type memory cell corresponding to said circuit section comprises two pairs of a load resistor and a MOS transistor, the two pairs are connected to form a flip-flop, and wherein said timer resistor and said third N-channel transistor are replicas of the resistor of one of the pairs and that of the MOS transistor of the other of the pairs.

* * * * *